(12) United States Patent
Shimizu et al.

(10) Patent No.: US 9,788,470 B2
(45) Date of Patent: Oct. 10, 2017

(54) COMPONENT SUPPLY DEVICE

(71) Applicant: FUJI MACHINE MFG. CO., LTD., Chiryu (JP)

(72) Inventors: Toshinori Shimizu, Kariya (JP); Hiroyasu Ohashi, Toyota (JP); Toshihiko Yamasaki, Nisshin (JP); Masaki Murai, Nishio (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 248 days.

(21) Appl. No.: 14/438,452

(22) PCT Filed: Oct. 29, 2012

(86) PCT No.: PCT/JP2012/077902
§ 371 (c)(1),
(2) Date: Apr. 24, 2015

(87) PCT Pub. No.: WO2014/068640
PCT Pub. Date: May 8, 2014

(65) Prior Publication Data
US 2015/0264846 A1    Sep. 17, 2015

(51) Int. Cl.
*H05K 13/02* (2006.01)
*H01L 21/677* (2006.01)
(Continued)

(52) U.S. Cl.
CPC ....... *H05K 13/02* (2013.01); *H01L 21/67721* (2013.01); *H01L 21/67724* (2013.01);
(Continued)

(58) Field of Classification Search
CPC ......... H01L 21/67721; H01L 21/67724; H01L 21/67775; H01L 21/6838; H01L 2224/7565
See application file for complete search history.

(56) References Cited

U.S. PATENT DOCUMENTS

| | | | | |
|---|---|---|---|---|
| 5,839,187 A | * | 11/1998 | Sato | ................... H01L 21/67144 29/743 |
| 8,296,937 B2 | * | 10/2012 | Burke | ............... H01L 21/67144 29/739 |

(Continued)

FOREIGN PATENT DOCUMENTS

| | | |
|---|---|---|
| JP | 04-245653 A | 9/1992 |
| JP | 2001-340821 A | 12/2001 |

(Continued)

OTHER PUBLICATIONS

International Search Report issued Nov. 27, 2012 in PCT/JP2012/077902 filed Oct. 29, 2012.

*Primary Examiner* — Minh Trinh

(74) *Attorney, Agent, or Firm* — Oblon, McClelland, Maier & Neustadt, L.L.P.

(57) ABSTRACT

The component supply device includes a table on which a wafer sheet is carried and a pickup head which picks up a component on the wafer sheet carried on the table. The pickup head includes multiple component supply side suction nozzles, and a switching mechanism which switches the multiple component supply side suction nozzles between a pickup position at which the tip of the multiple component supply side suction nozzles faces down and a transfer position at which the tip of the multiple component supply side suction nozzles faces up. The arrangement of the multiple component supply side suction nozzles corresponds to the arrangement of multiple mounter side suction nozzles equipped on the mounting head of the mounter.

6 Claims, 11 Drawing Sheets

(51) Int. Cl.
  *H01L 21/683* (2006.01)
  *H01L 23/00* (2006.01)
(52) U.S. Cl.
  CPC .... *H01L 21/67775* (2013.01); *H01L 21/6838* (2013.01); *H05K 13/021* (2013.01); *H01L 24/75* (2013.01); *H01L 2224/7565* (2013.01)

(56) References Cited

U.S. PATENT DOCUMENTS

2015/0264846 A1* 9/2015 Shimizu ............... H05K 13/021
  414/222.09
2015/0274435 A1* 10/2015 Shimizu ............... H05K 13/021
  414/222.01

FOREIGN PATENT DOCUMENTS

| | | |
|---|---|---|
| JP | 2002-118153 A | 4/2002 |
| JP | 2003-273166 A | 9/2003 |
| JP | 2004-047927 A | 2/2004 |
| JP | 2009-094296 A | 4/2009 |
| JP | 2009-194306 A | 8/2009 |

* cited by examiner

COMPONENT SUPPLY DEVICE

TECHNICAL FIELD

The technology disclosed in this specification relates to a component supply device which supplies components to a mounter which mounts components on a board.

BACKGROUND ART

As modes of supplying components to a mounter from a component supply device, there is a face-up supply mode which is performed when the sheet side surface of a component is mounted on a board, and there is a face-down supply mode which is performed when the opposite side to the sheet side surface of a component is mounted on a board. When a component is to be supplied face-down, a component on the sheet is picked up and flipped by a pickup head on the component supply device side, and then the flipped component is transferred to a mounting head on the mounter side. In Japanese Unexamined Patent Application Publication Number 2002-118153, a component supply device for performing face-down supply is disclosed.

BRIEF SUMMARY

Problem to be Solved

To reduce the time for mounting components on a board, it is required to supply components arranged on a sheet to the mounter side. With face-up supply, because a component on the sheet can be directly picked up by the mounting head on the mounter side, component supply to the mounter side can be performed in a short time. On the other hand, with face-down supply, because it is required to pick up and flip a component on the sheet with the pickup head on the component supply device side, it takes longer by that amount of time to supply components to the mounter side. With conventional technology, performing face-down supply in a short time has not been considered, and there is a problem that it takes time to supply components to the mounter side.

Means for Solving the Problem

In the component supply device disclosed in this specification, the pickup head on the component supply device side includes multiple component supply side suction nozzles. These multiple component supply side suction nozzles are switched between a pickup position at which the tip of the nozzles faces down and a transfer position at which the tip of the nozzles faces up. Also, the arrangement of the multiple component supply side suction nozzles corresponds to the arrangement of multiple mounter side suction nozzles equipped on the mounter side mounting head.

With this component supply device, because the pickup head includes multiple component supply side suction nozzles, multiple components on the sheet can be picked up and flipped by the pickup head at the same time. Also, because the arrangement of multiple component supply side suction nozzles on the pickup head corresponds to the arrangement of the mounter side suction nozzles on the mounting head, multiple components can be transferred from the pickup head to the mounting head at the same time. As a result, face-down supply can be performed in a short time compared with conventional devices.

Note that, in this specification, "corresponds to" mentioned above does not mean that the arrangement of component supply side suction nozzles and the arrangement of mounter side suction nozzles correspond completely, it is acceptable for at least a portion of the component supply side suction nozzles and mounter side suction nozzles to correspond such that multiple components can be transferred at the same time. It follows that, even if the number of suction nozzles on one side is greater than the number of nozzles on the other side, if multiple components can be transferred between these suction nozzles at the same time, the arrangement of these suction nozzles is equivalent to the above "corresponds to". Also, when only a portion of the suction nozzles on one side correspond to suction nozzles on the other side, if multiple components can be transferred between these suction nozzles at the same time, the arrangement of these suction nozzles is equivalent to the above "corresponds to".

A top view of the component mounting system of an embodiment.

FIG. 2

Figure 1:
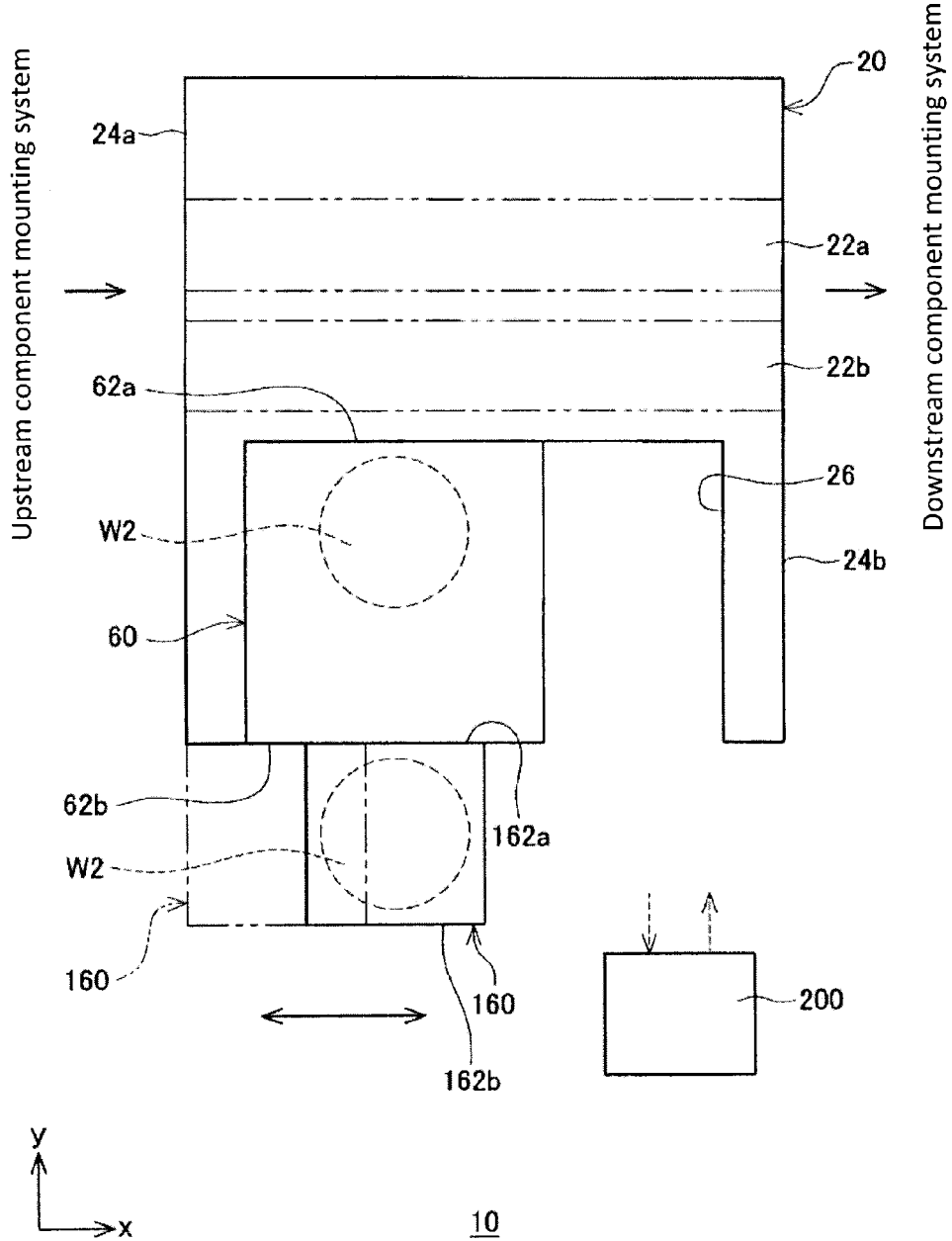
FIG. 1

A diagram to illustrate an outline configuration of the component supply device equipped in the component mounting system of FIG. 1.

FIG. 3

Diagram showing the attachment structure provided on the attachment surface of the wafer sheet replenishment section.

FIG. 4

Diagram showing the attachment structure provided on the attachment surface of the wafer sheet conveyance section.

FIG. 5

Figure 4:
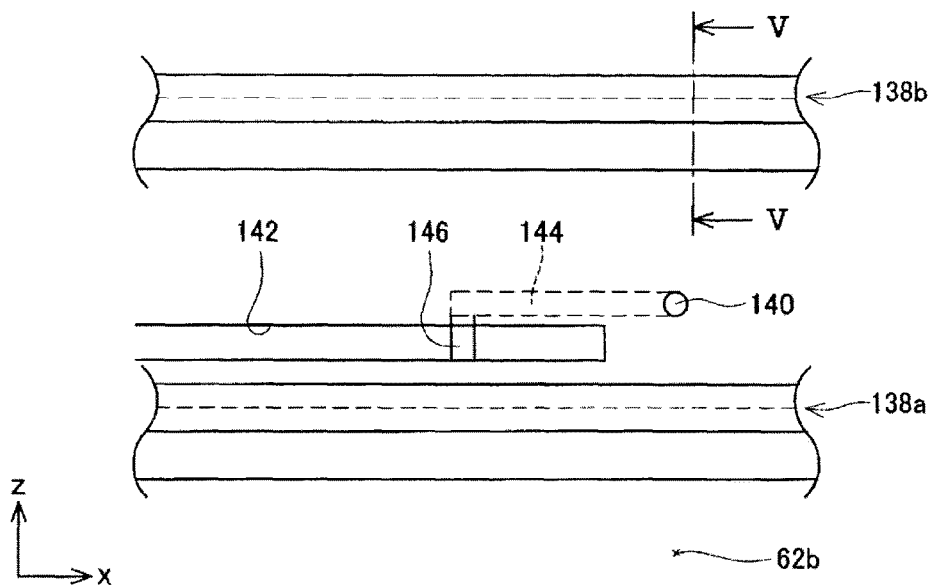

Diagram showing the attachment structure of the wafer sheet replenishment section and wafer sheet conveyance section from a cross section through the line V-V of FIG. 4.

FIG. 6

Figure 3:
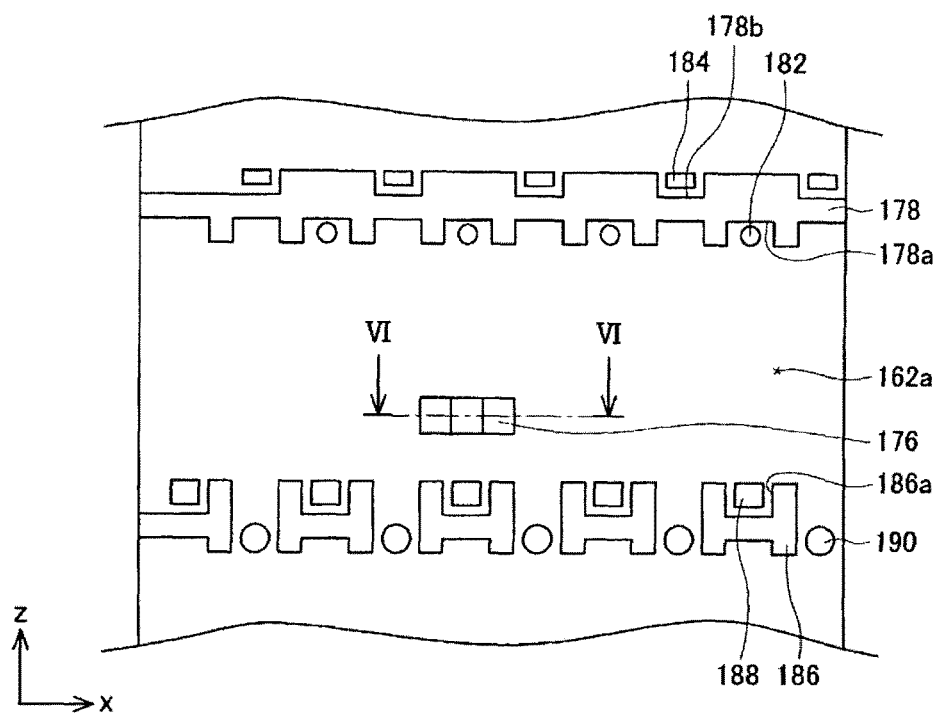

Diagram showing the attachment structure of the wafer sheet replenishment section and wafer sheet conveyance section from a cross section through the line VI-VI of FIG. 3.

FIG. 7

A front view schematically showing the structure of the moving table.

FIG. 8

Top view of the wafer table.

FIG. 9

Diagram showing both the state before rotation and the state after rotation of the wafer table.

FIG. 10

Diagram showing schematically the relationship between the moving table, pickup head, and mounting head during face-down supply.

FIG. 11

Side view of pickup head (in a state with nozzles positioned at the pickup position)

FIG. 12

Side view of pickup head (in a state with nozzles positioned at the transfer position)

FIG. 13

Diagram showing the mechanism to flip the pickup nozzles of the pickup head (in a state with nozzles positioned at the pickup position).

FIG. 14

Diagram showing the mechanism to flip the pickup nozzles of the pickup head (in a state with nozzles positioned at the transfer position).

FIG. 15

Diagram illustrating the path of the cam follower.

FIG. 16

Diagram showing the configuration of the axis section of the pickup head.

FIG. 17

Top view of wafer sheet.

FIG. 18

Flowchart showing the operation of the component mounting device when mounting components from a wafer sheet onto a board.

DETAILED DESCRIPTION

The component supply device of an embodiment of the technology disclosed in this specification is arranged adjacent to a mounter which includes a mounting head which mounts components on a board to supply components to the mounter. This component supply device includes a wafer sheet replenishment section which replenishes a wafer sheet on which multiple components are arranged on a sheet, and a wafer sheet conveyance section which conveys a wafer sheet replenished from the wafer sheet replenishment section. The wafer sheet conveyance section includes a table on which a wafer sheet is carried and a pickup head which picks up a component on the wafer sheet carried on the table. The pickup head includes multiple component supply side suction nozzles, and a switching mechanism which switches the multiple component supply side suction nozzles between a pickup position at which the tip of the multiple component supply side suction nozzles faces down and a transfer position at which the tip of the multiple component supply side suction nozzles faces up. Also, the arrangement of the multiple component supply side suction nozzles corresponds to the arrangement of multiple mounter side suction nozzles equipped on the mounting head of the mounter.

In this component supply device, multiple components on a wafer sheet carried on the table from the wafer sheet replenishment section can be picked up by the pickup head at the same time. Also, multiple components can be transferred between the pickup head and mounting head at the same time. As a result, components can be supplied more efficiently compared to previously from a component supply device to a mounter.

With the component supply device of the above embodiment, the pickup head may be attached movably in a level plane with respect to the table. Also, a wafer sheet conveyance section may be further provided with a mechanism which raises and lowers the table to which the pickup head is attached between a direct supply position and an indirect supply position which is below the direct supply position. In this case, the pickup head may be positioned above the table. Also, the height of the table when the table is positioned at the direct supply position may match the height of the component supply side suction nozzles when the table is positioned at the indirect supply position and the component supply side suction nozzles are positioned at the transfer position. According to this kind of configuration, the height of a component when the mounting head on the mounter side picks up a component directly from a wafer sheet and the height of a component when the mounting head on the mounter side picks up a component from the pickup head are the same. Due to this, it is possible to pick up a component from a sheet and pick up a component from the pickup head without changing the height of the mounting head on the mounter side.

Also, with the component supply device of the above embodiment, the pickup head may further have number one housing and number two housing which is rotatably supported with respect to number one housing and to which multiple component supply side suction nozzles are attached. Also, the switching mechanism may have a rack and pinion mechanism which rotates number two housing with respect to number one housing. According to this kind of configuration, component supply side suction nozzles can be rotated by a simple mechanism.

In addition, with the component supply device of the above embodiment, the switching mechanism may further have a rotation speed adjusting mechanism which decreases the rotation speed of number two housing in an area near the pickup position and transfer position slower than the rotation speed of number two housing in other areas. According to this kind of configuration, the impact when the rotation of the pickup head stops can be reduced.

Embodiment 1

Component mounting system 10 of the embodiment will be described using the figures. As shown in FIG. 1, component mounting system 10 includes a component supply device (60, 160), a mounter 20 arranged adjacent to the component supply device (60, 160), and control device 200 which controls the component supply device (60, 160) and mounter 20. First, the overall outline configuration of component mounting system 10 is described based on FIG. 1.

The component supply device (60, 160) includes wafer sheet replenishment section 160 and wafer sheet conveyance section 60. Wafer sheet W2 is replenished by an operator to wafer sheet replenishment section 160. The replenishment of wafer sheet W2 is performed from side surface 162b of the side opposite to the direction in which wafer sheet conveyance section 60 is provided. Wafer sheet conveyance section 60 unloads wafer sheet W2 replenished by an operator from wafer sheet replenishment section 160.

Figure 17:
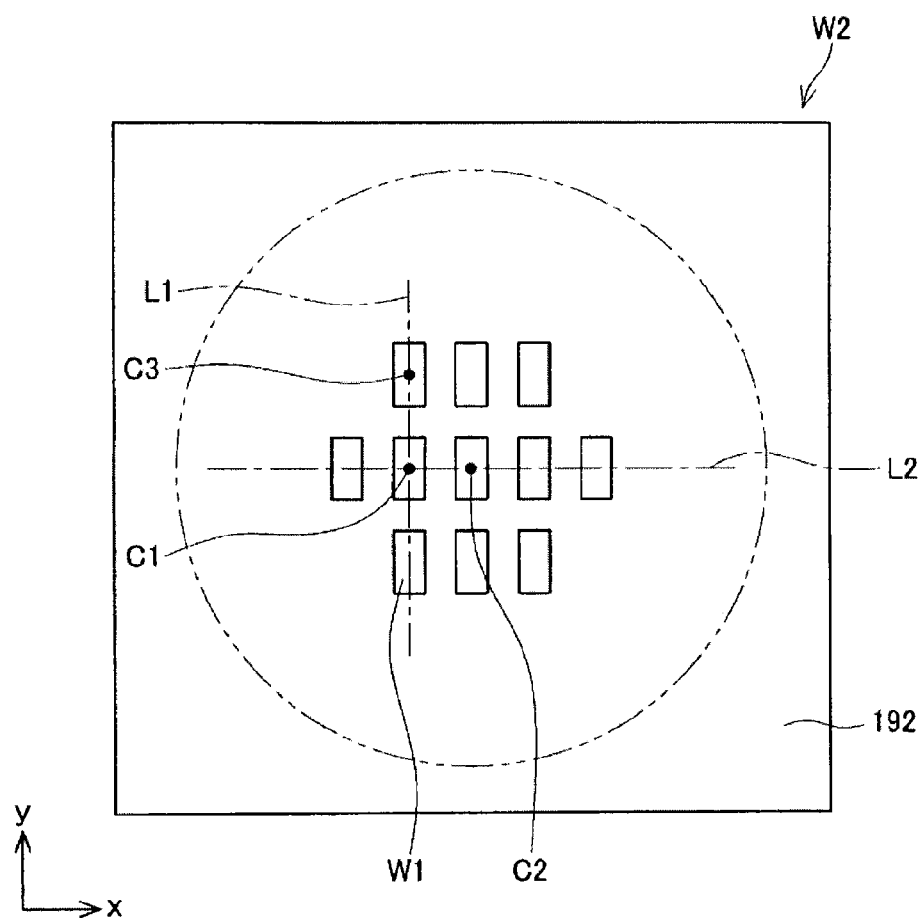

As shown in FIG. 17, wafer sheet W2 is provided with multiple components W1 arranged on sheet 192. Multiple components W1 are arranged in a specific pattern, that is, in the present embodiment, with a gap between each in the x direction and y direction. It follows that, straight line L1 which goes through the center (for example, C1, C3) of multiple components W1 distributed in the y direction extends in the y direction; and straight line L2 which goes through the center (for example, C1, C2) of multiple components W1 distributed in the x direction extends in the x direction. These straight lines L1 and L2 are used to calculate the skew of wafer sheet W2.

Returning to FIG. 1, wafer sheet conveyance section 60 is arranged adjacent to side surface 162a of the mounter side of wafer sheet replenishment section 160. As given below, wafer sheet replenishment section 160 is slidably attached with respect to side surface 62b of wafer sheet conveyance section 60. Wafer sheet conveyance section 60 conveys wafer sheet W2 unloaded from wafer sheet replenishment section 160 to a component supply position near mounter 20 (a position near mounter 20).

Mounter 20 is arranged adjacent to side surface 62a of wafer sheet conveyance section 60 (that is, the side surface on the opposite side to the wafer sheet replenishment section 160 side). Specifically, recess section 26 is provided in the surface on the wafer sheet conveyance section 60 side of mounter 20, and wafer sheet conveyance section 60 is housed inside this recess section 26. And, mounter 20 is arranged with respect to wafer sheet conveyance section 60 such that side surface 62a of wafer sheet conveyance section 60 contacts the bottom surface of recess section 26 of mounter 20. Note that, when mounter 20 is arranged with respect to wafer sheet conveyance section 60, a space is formed at the right side of wafer sheet conveyance section 60. A loading table (for example, a feeder device table) on which is loaded another component supply device (for example, a feeder) and so on not shown in the figures is installed in this space. Mounter 20 includes board conveyance sections 22a and 22b which convey boards. An upstream component mounting system is arranged at left side surface 24a of mounter 20. A downstream component mounting system is arranged at right side surface 24b of mounter 20. Boards on which components have been mounted at the upstream component mounting system are supplied to board conveyance sections 22a and 22b. A board supplied to board conveyance sections 22a and 22b is sent to the center of mounter 20. Mounting head 30 of mounter 20 picks up component W1 from wafer sheet W2 conveyed to a component supply position by wafer sheet conveyance section 60 and mounts picked up component W1 on a board on board conveyance section 22a, 22b. The board on which component W1 was mounted, is sent to a downstream component mounting system by board conveyance sections 22a, 22b. By passing the board through multiple component mounting systems, the required components can be attached to the board. Note that, an upstream component mounting system may be arranged at right side surface 24b of mounter 20 and a downstream component mounting system may be arranged at left side surface 24a of mounter 20. In this case, boards are conveyed from right side surface 24b to left side surface 24a of mounter 20.

(Wafer Sheet Replenishment Section 160)

Figure 2:
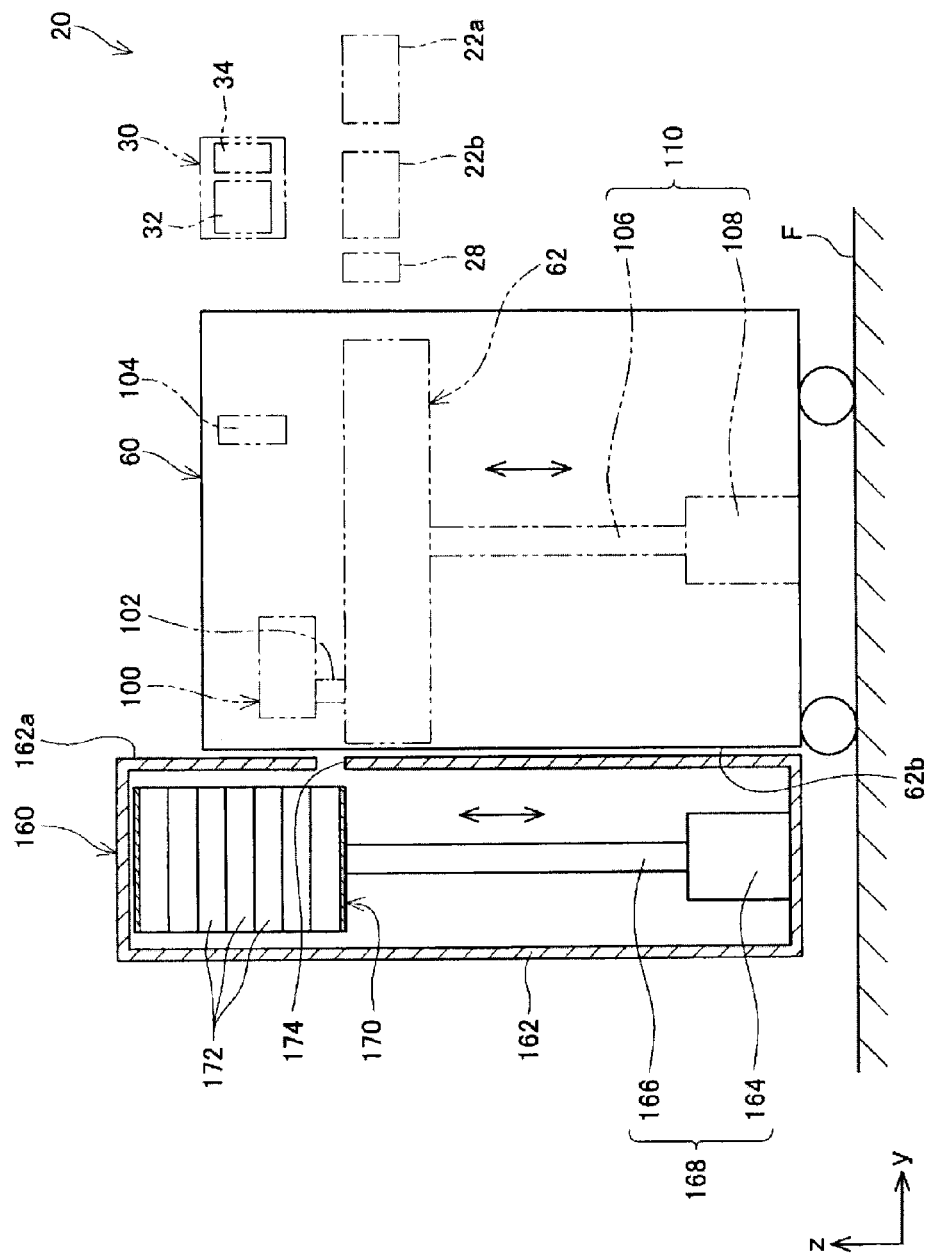

Next, details are described of each section of component mounting system 10. First, wafer sheet replenishment section 160 is described. As shown in FIG. 2, wafer sheet replenishment section 160 is provided with housing 162, magazine 170, and raising/lowering mechanism 168.

Housing 162 houses magazine 170 and raising/lowering mechanism 168. Unloading hole 174 for unloading wafer sheet W2 is formed in side surface 162a on the wafer sheet conveyance section 60 side of housing 162. Also, a slide mechanism (described below) for sliding wafer sheet replenishment section 160 with respect to wafer sheet conveyance section 60 is provided between side surface 162a of housing 162 and side surface 62b of wafer sheet conveyance section 60.

Magazine 170 is provided with multiple wafer sheet housing sections 172 which house wafer sheet W2. Multiple wafer sheet housing sections 172 are stacked in the height direction (z direction). Wafer sheet W2 is housed in each wafer sheet housing section 172. Magazine 170 is formed such that the x-z cross-section is a rectangular tube. That is, the rear end of magazine 170 (the end on the opposite side to wafer sheet conveyance section 60) and the front end of magazine 170 (the end on the wafer sheet conveyance section 60 side) are open. Due to this, an operator can replenish wafer sheet W2 to wafer sheet housing section 172 from the rear end of magazine 170. On the other hand, wafer sheet W2 stored in wafer sheet housing section 172 can be unloaded to wafer sheet conveyance section 60 from the front of magazine 170.

Raising/lowering mechanism 168 includes ball screw 166 and motor 164 which rotates ball screw 166. A nut (not shown in the figures) which engages with ball screw 166 is fixed to magazine 170. Due to this, when ball screw 166 is rotated by motor 164, magazine 170 moves up/down inside housing 162. By moving magazine 170 up/down, any wafer sheet housing section 172 inside magazine 170 can be aligned with the height of unloading hole 174 of housing 162. By this, wafer sheet W2 can be unloaded from wafer sheet housing section 172 to wafer sheet conveyance section 60 through unloading hole 174. Note that, the conveyance of wafer sheet W2 from wafer sheet housing section 172 to wafer sheet conveyance section 60 is performed by a robot not shown in the figures.

Here, the slide mechanism for sliding wafer sheet replenishment section 160 with respect to wafer sheet conveyance section 60 is described. The slide mechanism includes slide blocks 178 and 186 and so on provided in side surface 162a of wafer sheet replenishment section 160, and engagement grooves 138a and 138b and so on formed in side surface 62b of wafer sheet conveyance section 60.

As shown in FIG. 3, number one slide block 178 extending in the x direction, and multiple number two slide blocks 186 arranged at intervals in the z direction with respect to number one slide block 178, are provided on side surface 162a of wafer sheet replenishment section 160 (that is, side surface 162a of housing 162).

Multiple recess sections 178a which house guide roller 182, and multiple recess sections 178b which house guide roller 184, are formed in number one slide block 178. Guide roller 182 is rotatable about a rotation axis which is parallel to the y axis (an axis perpendicular to the surface of the page). Guide roller 184 is rotatable about a rotation axis which is parallel to the z axis. Number one slide block 178 is fixed to side surface 162a of housing 162 via base block 180 (refer to FIG. 5).

Multiple number two slide blocks 186 are arranged in the x direction with intervals between each other. The direction in which multiple number two slide blocks 186 are arranged is parallel to the direction in which number one slide block 178 extends. Multiple number two slide blocks 186 are also fixed to side surface 162a of housing 162 via a base block not shown in the figures. Recess section 186a which houses guide roller 188 is formed in each number two slide block 186. Guide roller 188 is rotatable about a rotation axis which is parallel to the z axis. Guide roller 190 is arranged between adjacent number two slide blocks 186. Guide roller 190 is rotatable about a rotation axis which is parallel to the y axis (an axis perpendicular to the surface of the page).

Engagement block 176 is arranged at an intermediate position in the height direction of number one slide block 178 and number two slide blocks 186. Engagement block 176 is fixed to side surface 162a of housing 162. In the center section of engagement block 176, recess groove 176a is formed (refer to FIG. 6). Recess groove 176a is recessed from the wafer sheet conveyance section 60 side to the wafer sheet replenishment section 160 side.

Figure 5:
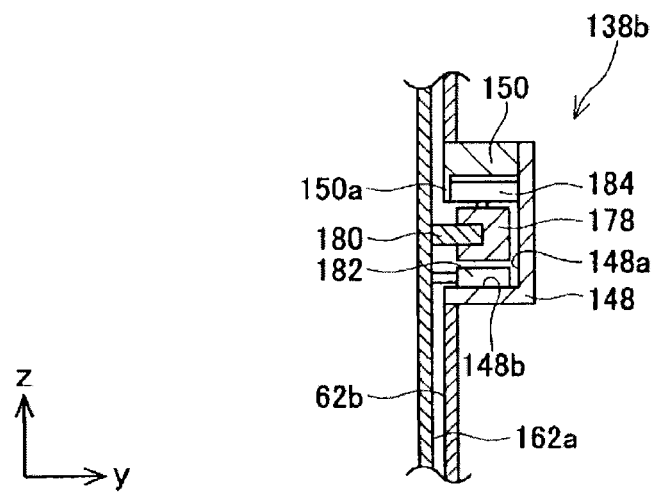

As shown in FIG. 4, number one engagement groove 138b in which number one slide block 178 is housed, and number two engagement groove 138a in which number two slide blocks 186 are housed, are formed in side surface 62b of wafer sheet conveyance section 60. Number one engagement groove 138b and number two engagement groove 138a extend in the x direction. As shown in FIG. 5, number one engagement groove 138b is configured from number one frame member 148 and number two frame member 150 attached to the upper end of number one frame member 148. Number one slide block 178 and guide rollers 182 and 184 are housed in the space surrounded by number one frame member 148 and number two frame member 150. Guide roller 182 contacts surface 148b which extends in the y direction of number one frame member 148. Due to this, a force acts in the z direction between guide roller 182 and number one frame member 148. As given above, guide roller 182 is rotatable about a rotation axis which is parallel to the y axis. Due to this, wafer sheet replenishment section 160 is supported in the z direction by guide roller 182 while being slidable in the x direction (the direction perpendicular to the surface of the page) with respect to wafer sheet conveyance section 60. Guide roller 184, as well as contacting surface 148a which extends in the z direction of number one frame member 148, contacts protrusion 150a of number two frame member 150. Due to this, a force acts in the y direction between guide roller 184 and frame members 148 and 150. As given above, guide roller 184 is rotatable about a rotation axis which is parallel to the z axis. Due to this, wafer sheet replenishment section 160 is supported in the y direction by guide roller 184 while being slidable in the x direction with respect to wafer sheet conveyance section 60. Note that in FIG. 5 guide roller 182 and guide roller 184 are shown, but actually, as in FIG. 3, the position in the x direction of guide roller 182 and guide roller 184 is not the same. It should be borne in mind that in FIG. 5, for convenience of description, guide roller 182 and guide roller 184 are shown in the same figure.

Number two engagement groove 138a is configured in the same way as number one engagement groove 138b. That is, number two slide blocks 186 and guide rollers 188 and 190 are housed inside number two engagement groove 138a, and guide rollers 188 and 190 contact the inside surface of number two engagement groove 138a. Wafer sheet replenishment section 160 is supported in the y direction and z direction with respect to wafer sheet conveyance section 60 by guide rollers 188 and 190.

As shown in FIG. 4, guidance groove 142 is formed in side surface 62b of wafer sheet conveyance section 60. Guidance groove 142 is positioned between number one engagement groove 138b and number two engagement groove 138a, and extends in the x direction. Lock pin 146 is arranged inside guidance groove 142. Lock pin 146 is connected to one end of link member 144. The other end of link member 144 is connected to release button 140. Lock pin 146 is biased towards the position shown by the solid line in FIG. 6 by a biasing means (for example, a spring) not shown in the figure. When an operator operates release button 140, lock pin 146 retracts to the position shown by the dotted line in FIG. 6.

Engagement block 176 of wafer sheet replenishment section 160 is arranged inside the above guidance groove 142. The range in which wafer sheet replenishment section 160 is slidable with respect to wafer sheet conveyance section 60 is regulated by the arrangement of engagement block 176 inside guidance groove 142. By this, the undesirable disconnection of wires which connect apparatuses on the wafer sheet replenishment section 160 side and apparatuses of the wafer sheet conveyance section 60 side can be prevented.

Also, lock pin 146 is engagable with recessed groove 176a of engagement block 176 arranged inside guidance groove 142. By lock pin 146 engaging with recessed groove 176a of engagement block 176, wafer sheet replenishment 160 becomes unable to be slid with respect to wafer sheet conveyance section 60. In the present embodiment, unloading of wafer sheet W2 from wafer sheet replenishment section 160 to wafer sheet conveyance section 60 is only possible when wafer sheet replenishment section 160 is in a state not slidable with respect to wafer sheet conveyance section 60. By this, the unloading of wafer sheet W2 from wafer sheet replenishment section 160 to wafer sheet conveyance section 60 at a wrong position can be prevented.

Figure 6:
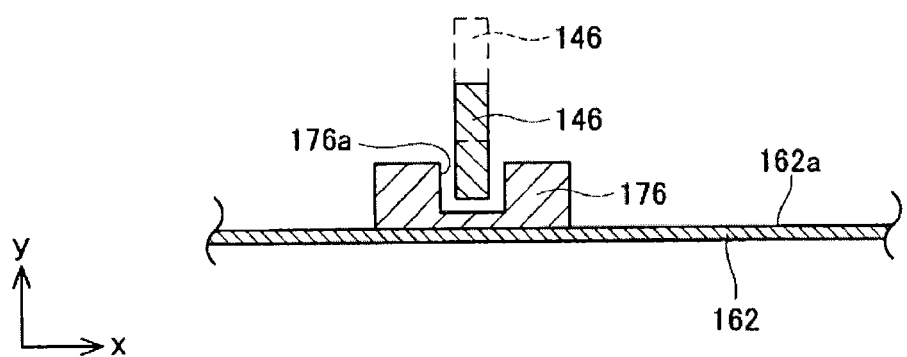

Conversely, when an operator operates release button 140, lock pin 146 is removed from recessed groove 176a of engagement block 176 (lock pin 146 retracts to the position indicated by the dotted line in FIG. 6). By this, wafer sheet replenishment section 160 becomes slidable with respect to wafer sheet conveyance section 60. If follows that, when wafer sheet replenishment section 160 is to be slid, an operator just needs to operate release button 140 and push wafer sheet replenishment section 160 in the sliding direction.

Note that, as in FIG. 1, wafer sheet replenishment section 160 is slidable in the x direction (that is, the direction perpendicular to the direction in which wafer sheet W2 is supplied [y direction]) with respect to wafer sheet conveyance section 60. And, the range in which wafer sheet replenishment section 160 is slidable in the present embodiment is the range from the position shown by the solid lines to the position shown by the dashed lines in FIG. 1, which is inside the x direction width of mounter 20. Due to this, even if wafer sheet replenishment section 160 is slid, wafer sheet replenishment section 160 does not interfere with an upstream component mounting system, nor does wafer sheet replenishment section 160 interfere with a downstream component mounting system. Also, as is clear from FIG. 1, in the position shown by the dashed lines with wafer sheet replenishment section 160 slid to the left, side surface 62b of wafer conveyance section 60 is widely open. Due to this, when errors and the like occur with mounter 20, an operator can operate release button 140 and slide wafer sheet replenishment 160 to maintain sufficient space to access mounter 20. Because there is no need to provide space in advance to access mounter 20, component mounting system 10 can be made compact.

(Wafer Sheet Conveyance Section 60)

Next, wafer sheet conveyance section 60 is described. As shown in FIG. 2, wafer sheet conveyance section 60 includes moving table 62, table raising/lowering mechanism 110 which raises/lowers moving table 62, pickup head 100 which is movable in the xy direction with respect to moving table 62, and camera 104 for taking an image of wafer sheet W2 loaded on moving table 62.

Figure 7:
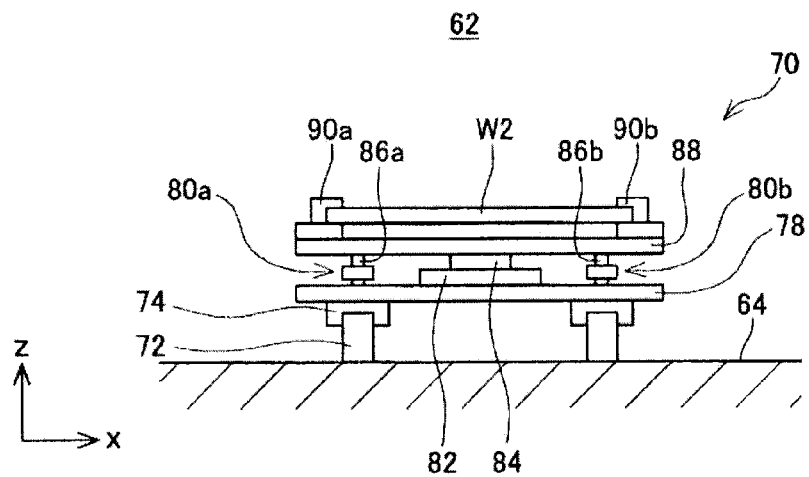

As shown in FIG. 7, moving table 62 includes base 64, slider 78 which slides with respect to base 64, and wafer table 88 which rotates with respect to slider 78. Base 64 is movable in the up/down direction by table raising/lowering mechanism 110. That is, as shown in FIG. 2, table raising/lowering mechanism 110 includes ball screw 106, and motor 108 to rotate ball screw 106. Nut (not shown in the figures) which engages with ball screw 108 is fixed to base 64. Due to this, when ball screw 106 is rotated by motor 108, base 64 moves in the up/down direction. By base 64 being moved in the up/down direction, wafer table 88 is also moved in the up/down direction.

Slider 78 is supported slidably in the y direction with respect to base 64. Specifically, guide 72 is provided on the upper surface of base 64. Guidance section 74 of slider 78 engages with guide 72. Due to this, slider 78 is supported movable in the y direction with respect to base 64. The movement of slider 78 is performed by a ball screw mechanism and motor for rotating the ball screw mechanism which are not shown in the figures.

Figure 8:
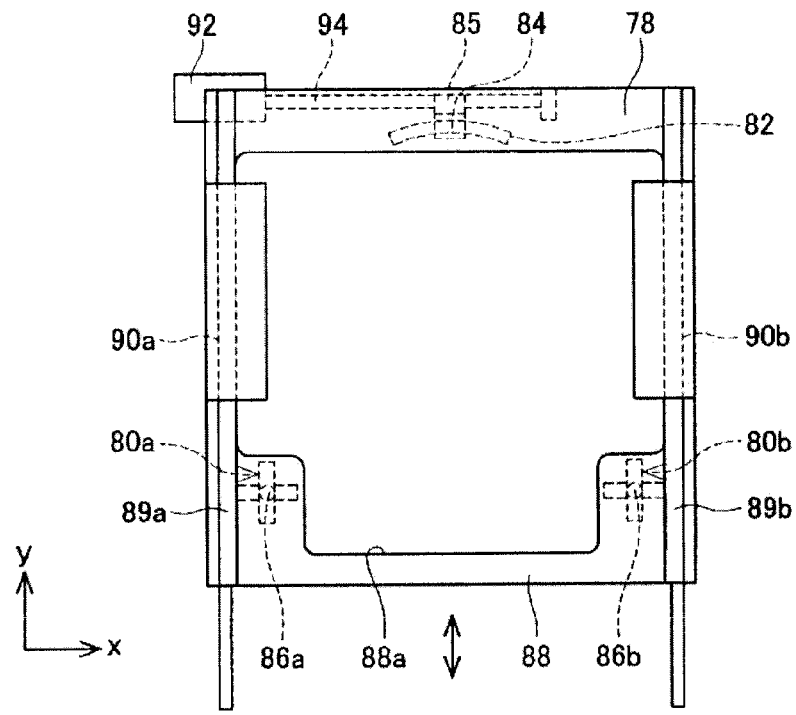
Figure 9:
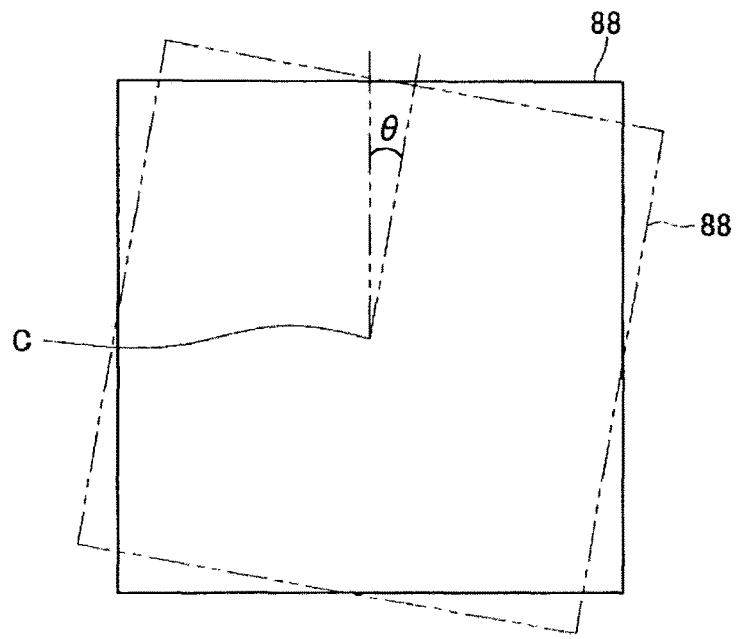

As shown in FIGS. 7 and 8, wafer table 88 is rotatably supported around a rotation axis (hereafter, θ axis [specifically, the axis extending in the z direction passing through point C shown in FIG. 9]) extending in the z direction on slider 78. Specifically, R guide 82 is provided on the border of the mounter 20 side of slider 78. Slider 84 is attached to the underside of wafer table 88 and slider 84 is guided by R guide 82. Also, cross guides 80*a* and 80*b* are provided on the border of the left and right of slider 78. Support points 86*a* and 86*b* set on the underside of wafer table 88 are supported by cross guides 80*a* and 80*b* (in detail, by a ball bearing of cross guides 80*a* and 80*b*). It follows that, wafer table 88 is supported on slider 78 at three points: the position at which slider 84 is provided, support point 86*a*, and support point 86*b*.

Here, the three points at which slider 84, support point 86*a*, and support point 86*b* are provided are set such that they are on the circumference of the same circle which includes point C as its center as shown in FIG. 9. That is, wafer table 88 is supported by three points on the same circumference with point C at its center (θ axis). Also, the curvature of R guide 82 is set such that slider 84 moves this circumference of the same circle with point C (θ axis) at its center. Due to this, when slider 84 moves in an arc around the θ axis guided by R guide 82, support points 86*a* and 86*b* also move in an arc around the θ axis guided by cross guides 80*a* and 80*b*. As a result, wafer table 88 moved about the θ axis.

In the present embodiment, a ball screw mechanism (94, 85) is used to rotate wafer table 88 about the θ axis. That is, as shown in FIG. 8, ball screw 94 is rotatably supported at the border of the mounter 20 side of slider 78. The output axis of motor 92 is fixed to an end of ball screw 94, and ball screw 94 is rotated by motor 92. Ball screw 94 extends in the x direction and is engaged with nut member 85. Nut member 85 and slider 84 are connected such that they move as one in the x direction and can change relative position in the y direction. It follows that, when ball screw 94 is rotated by motor 92, nut member 85 moves in the x direction following ball screw 94. Slider 84 moves in the x direction while being guided by R guide 82 according to the x direction movement of nut member 85. By this, as shown in FIG. 9, wafer table 88 rotates about the θ axis.

A loading surface on which wafer sheet W2 is loaded is formed on the above wafer table 88. As shown in FIG. 8, opening 88*a* is formed in the center of the loading surface of wafer table 88. By opening 88*a* being formed in the center of the loading surface, it is possible to arrange a mechanism which pushes up wafer sheet W2 on the side under wafer sheet W2. By pushing up wafer sheet W2 from the underside, component W1 can be easily picked up from wafer sheet W2. Note that, an image of wafer sheet W2 loaded on wafer table 88 can be captured by camera 104 fixed on moving mechanism 102.

Also, as shown in FIGS. 7 and 8, clamp attachment sections 89*a* and 89*b* which extend in the y direction are provided on the border of the left and right of wafer table 88. Wafer clamps 90*a* and 90*b* are attached to clamp attachment sections 89*a* and 89*b*. Wafer sheet W2 is clamped by wafer clamps 90*a* and 90*b* such that wafer sheet W2 is held on wafer table 88.

Figure 11:
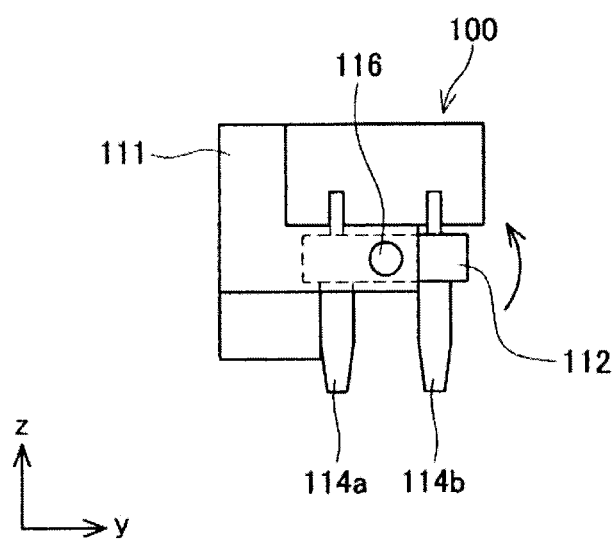
Figure 12:
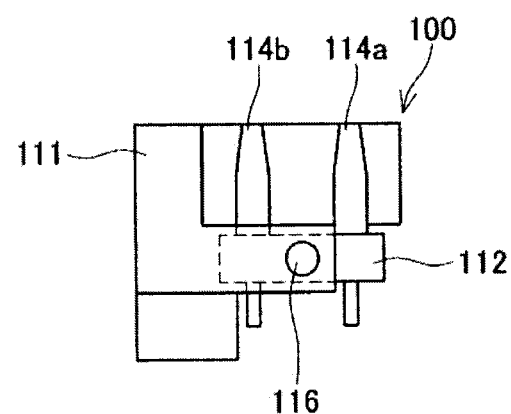

Next, pickup head 100 is described. As shown in FIGS. 11 and 12, pickup head 100 includes number one housing 111, rotation axis 116 which is rotatably supported with respect to number one housing 111, and number two housing 112 which is fixed to rotation axis 116. Multiple suction nozzles 114*a* and 114*b* are attached to number two housing 112. The arrangement of multiple suction nozzles 114*a* and 114*b* corresponds to the arrangement of multiple suction nozzles 32 equipped on mounting head 30 of mounter 20. Because multiple suction nozzles 114*a* and 114*b* are attached to number two housing 112, when number two housing 112 is rotated together with rotation axis 116, suction nozzles 114*a* and 114*b* move between a pickup position at which the tip of suction nozzles 114*a* and 114*b* faces down (the state in FIG. 11), and a transfer position at which the tip of suction nozzles 114*a* and 114*b* faces up (the state in FIG. 12).

Figure 13:
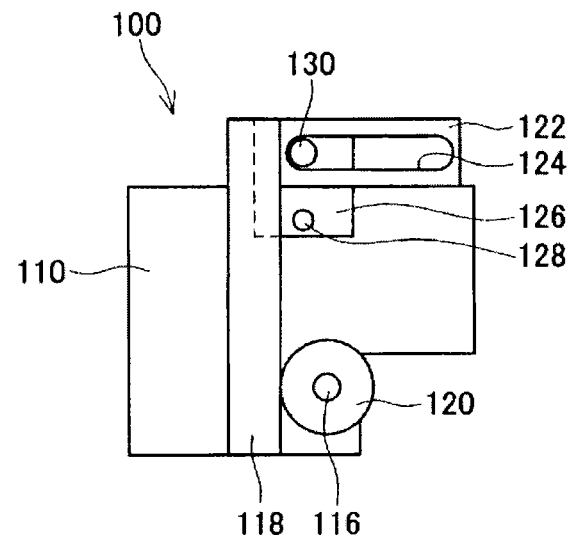
Figure 14:
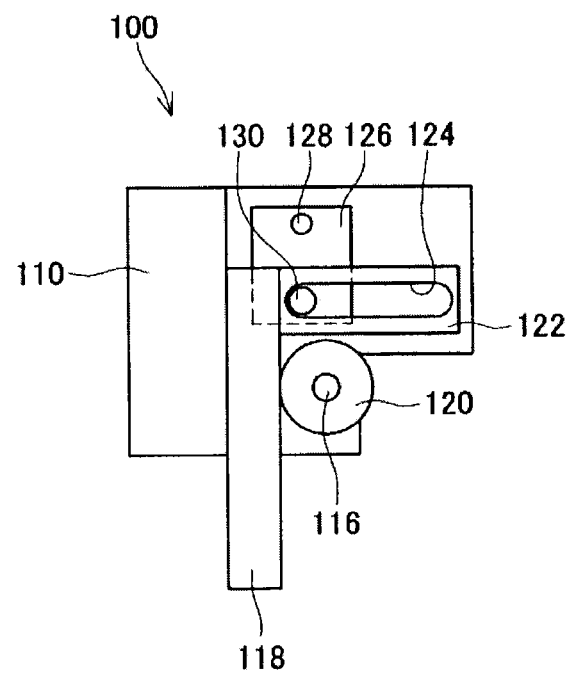

As shown in FIGS. 13 and 14, pickup head 100 is provided with a mechanism (118, 120, and so on) for switching suction nozzles 114*a* and 114*b* between the pickup position and the transfer position. That is, rack 118 is attached movably in the up/down direction on number one housing 110. Pinion gear 120 is engaged with rack 118. Pinion gear 120 is fixed to rotation axis 116. It follows that, by moving rack 118 up/down, pinion gear 120 and rotation axis 116 rotate, and suction nozzles 114*a* and 114*b* move between the pickup position and the transfer position.

The above up/down movement of rack 118 is performed by rotation member 126 being rotated about support axis 128. That is, cam follower 122 is attached to the upper end of rack 118. Guidance groove 124 is formed in cam follower 122. Pin 130 is engaged with guidance groove 124 of cam follower 122 and pin 130 is fixed to an end of rotation member (cam member) 126. Due to this, when rotation member 126 is rotated about support axis 128 by an actuator which is not shown in the figures (for example, an air cylinder), pin 130 also moves according to the rotation of rotation member 126. By this, cam follower 122 to which pin 130 is also engaged moves in the up/down direction and rack 118 moves in the up/down direction.

Figure 15:
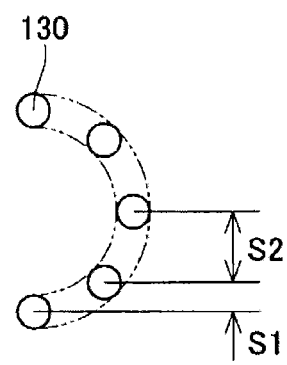

As is clear from the above description, the moving speed in the up/down direction of cam follower 122 (that is, rack 118) is slow when suction nozzles 114*a* and 114*b* are near the pickup position and the transfer position, and fast when suction nozzles 114*a* and 114*b* are between the pickup position and the transfer position. That is, as shown in FIG. 15, when suction nozzles 114*a* and 114*b* are near the pickup position and the transfer position, the up/down direction movement amount S1 is small with respect to the change in the rotation angle of pin 130. Conversely, when suction nozzles 114*a* and 114*b* are between the pickup position and the transfer position, up/down direction movement amount S2 is large with respect to the change in the rotation angle of pin 130. Due to this, by using the above cam mechanism (122, 126, 130), the rotation speed of number two housing 112 when suction nozzles 114*a* and 114*b* are near the pickup position and the transfer position can be made low. By this, the impact when number two housing 112 stops rotating can be reduced.

Figure 16:
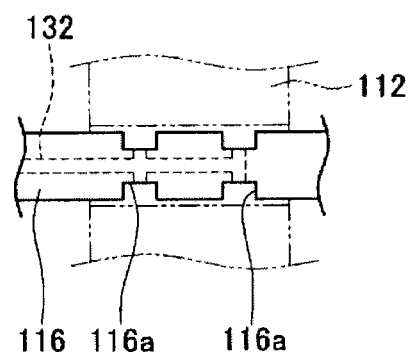

Note that, as shown in FIG. 16, intake passage 132 is formed in rotation axis 116 of pickup head 100. Groove 116*a* is formed on the outer peripheral surface of rotation axis 116 and an end of intake passage 132 is connected to the bottom surface of groove 116*a*. Also, the intake passage of suction nozzles 114*a* and 114*b* is connected to groove 116*a* of rotation axis 116. It follows that, suction nozzles 114*a* and 114*b* are connected to a suction device via groove 116*a* and intake passage 132. By providing intake passage 132 inside rotation axis 116, intake piping to suction nozzles 114*a* and 114*b* can be made unnecessary.

Also, pickup head 100 and camera 104 are movable in the xy direction with respect to moving table 62 by moving mechanism 102 attached to moving table 62. By this, component W1 loaded at any position on wafer sheet W2 can be picked up by pickup head 100 and an image of component W1 can be taken by camera 104. A well-known mechanism (for example, a ball screw mechanism and so on) can be used for moving mechanism 102. Note that, as is clear from the above description, pickup head 100 and camera 104 are attached to moving table 62 via moving mechanism 102. Due to this, when moving table 62 is moved in the up/down direction by table raising/lowering mechanism 110, pickup head 100 and camera 104 also move in the up/down direction correspondingly.

(Mounter 20)

Next, mounter 20 is described. Note that, as conventional well-known items can be used for mounter 20, here the configuration of mounter 20 is described simply. As is shown in FIG. 2, mounter 20 includes board conveyance sections 22a and 22b, mounting head 30, and component camera 28. Board conveyance sections 22a and 22b convey boards which are loaded on a conveyor belt by rotating the conveyor belt. Mounting head 30 is provided with multiple suction nozzles 32 for picking up component W1, and mark camera 34 for reading fiducial marks of wafer sheet W2. The arrangement of suction nozzles 32 of mounting head 30 corresponds to the arrangement of pickup nozzles 114a and 114b of pickup head 100. That is, mounting head 30 can receive multiple components W1 being held on suction nozzles 114a and 114b of pickup head 100 at the same time. Note that, mounting head 30 is movable in the xy direction by an x-direction moving mechanism and a y-direction moving mechanism not shown in the figures. Component camera 28 performs reading and so on of components W1 picked up by mounting head 30.

Figure 18:
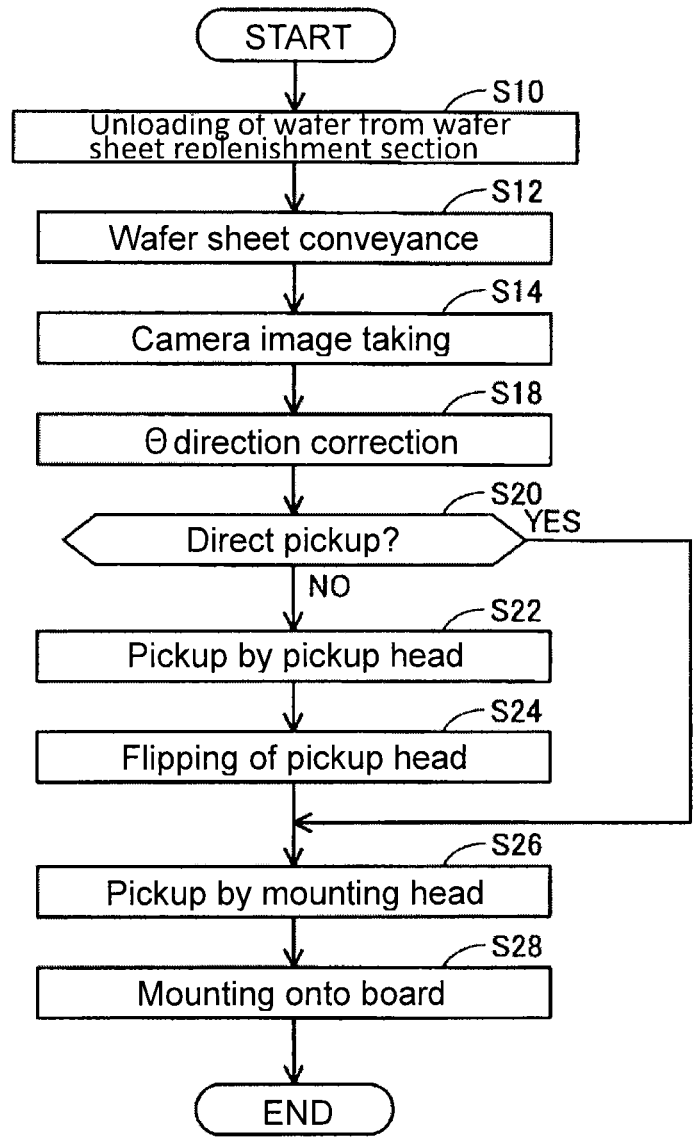

Next, the operation of the above component mounting system 10 is described with reference to FIG. 18. As shown in FIG. 18, first, wafer sheet W2 is conveyed from wafer sheet replenishment section 160 (S10). Specifically, control device 200 drives raising/lowering mechanism 168 and positions one of the wafer sheet housing sections 172 at unloading hole 174. Also, control device 200 drives moving table 62 and positions wafer table 88 at the wafer sheet loading position (a position near wafer sheet replenishment section 160). The wafer sheet loading position is the position to which wafer sheet W2 is unloaded from unloading hole 174 of wafer sheet replenishment section 160, and is set near unloading hole 174 of wafer sheet replenishment section 160. Next, control device 200 drives a robot and loads wafer sheet W2 housed in wafer housing section 172 onto the loading surface of wafer table 88.

When wafer sheet W2 has been loaded onto wafer table 88, control device 200 drives moving table 62 and positions wafer table 88 at the component supply position (a position near mounter 20) (S12). The component supply position is set near mounter 20 and is a position at which supply of component W1 to mounting head 30 from wafer sheet W2 is performed.

Next, control device 200 takes an image of wafer sheet W2 loading on wafer table 88 by camera 104 (S14). When an image of wafer sheet W2 has been taken, control device 200 calculates the deviation amount in the θ direction of wafer sheet W2 from that taken image. That is, replenishment of wafer sheet W2 to wafer sheet housing section 172 is performed by an operator, and the loading of wafer sheet W2 from wafer sheet housing section 172 to wafer table 88 is performed by a robot. It follows that, there are cases in which wafer sheet W2 is not loaded on wafer table 88 at the predetermined set angle. Due to this, an image is taken of wafer sheet W2 on wafer table 88 by camera 104 and the deviation amount (deviation in the θ direction [angle deviation]) of wafer sheet W2 is calculated. Note that, the deviation in the θ direction of wafer sheet W2 can be calculated by the procedure below. That is, the center point C1 to C3 of multiple components W1 can be calculated from an image taken by camera 104 as shown in FIG. 17. Then, the θ direction deviation (angle deviation) of wafer sheet W2 is calculated from the slope of straight line L2 which connects center point C1 and center point C2, and of straight line L1 which connects center point C1 and center point C3.

When the deviation amount of wafer sheet W2 has been calculated, control device 200 drives moving table 62 and corrects the position deviation about the θ axis (S18). By this, wafer sheet W2 is positioned at the predetermined orientation (angle).

Next, control device 200 judges whether component W1 on wafer sheet W2 is to be picked up directly by mounting head 30 (S20). That is, control device 200 judges whether component W1 of wafer sheet W2 is to be supplied face-up or face-down. In cases in which direct pickup is to be performed by mounting head 30 (S20 is yes), steps S22 and 24 are skipped and processing proceeds to step S26.

Figure 10:
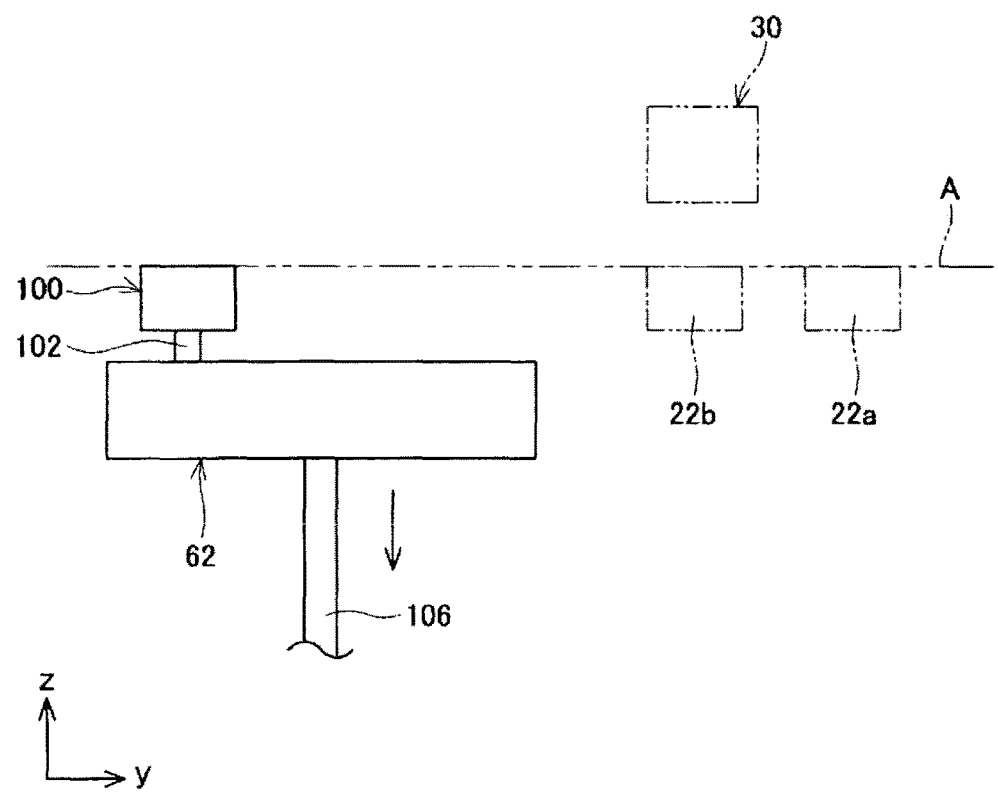

Conversely, in cases in which direct pickup by mounting head 30 of component W1 on wafer sheet W2 is not to be performed (S20 is no), control device 200 drives pickup head 100 and component W1 on wafer sheet W2 is picked up by pickup head 100 (S22). Because pickup head 100 includes multiple suction nozzles 114a and 114b, multiple components W1 are picked up by pickup head 100. Continuing, control device 200, by rotating number two housing 112 moves pickup nozzles 114a and 114b of pickup head 100 from the pickup position to the transfer position. Also, control device 200 drives table raising/lowering mechanism 110 and lowers moving table 62. That is, as is clear from FIGS. 2 and 10, pickup head 100 is positioned lower than moving table 62 (specifically, wafer table 88). For this, moving table 62 is lowered such that the tip of pickup nozzles 114a and 114b is at the height of reference surface A (shown in FIG. 10). Because moving table 62 and pickup head 100 are connected via moving mechanism 102, if moving table 62 is lowered, pickup head 100 can also be lowered. Here, reference surface A is at the position (height) of wafer table 88 when component W1 on wafer sheet W2 is directly picked up by mounting head 30. In the present embodiment, because pickup nozzles 114a and 114b are positioned at reference surface A, the height at which mounting head 30 picks up component W1 does not change between face-up supply and face-down supply. Due to this, pickup of component W1 by mounting head 30 can be performed easily.

Next, control device 200 picks up component W1 with mounting head 30 (S26). That is, when component W1 on wafer sheet W2 is picked up directly by mounting head 30, component W1 is picked up from wafer sheet W2 on wafer table 88. Conversely, when component W1 is picked up by suction nozzles 114a and 114b of pickup head 100, component W1 is picked up from pickup nozzles 114a and 114b of pickup head 100. Here, because the arrangement of suction nozzles 114a and 114b of pickup head 100 and the arrangement of suction nozzles 32 of mounting head 30 correspond, multiple components W1 can be transferred from pickup head 100 to mounting head 30 at the same time. Note that, it is fine if some of the suction nozzles provided on pickup head 100 and the suction nozzles provided on mounting head 30 correspond such that multiple components W1 can be transferred at the same time. For example, the suction nozzles of pickup head 100 may be arranged in two rows of two (that is, an arrangement lined up with two in the x direction and two in the y direction), and the suction nozzles of mounting head 30 may be arranged in one row of two, such that two components W1 are transferred from pickup head 100 to the mounting head 30 at the same time. Alternatively, the suction nozzles of pickup head 100 may be arranged in one row of two, and the suction nozzles of mounting head 30 may be arranged in two rows of two such that two components W1 are transferred from pickup head 100 to the mounting head 30 at the same time. Further, the suction nozzles of pickup head 100 may be arranged in four rows of two, and the suction nozzles of mounting head 30 may be arranged in two rows of four such that four components W1 are transferred from pickup head 100 to the mounting head 30 at the same time.

When components W1 are picked up by mounting head 30, control device 200 drives mounting head 30 and mounts components W1 picked up by mounting head 30 onto a board on board conveyance section 22a, 22b. By this, components W1 are mounted onto a board.

As described above, in component mounting system 10 of the present embodiment, because wafer replenishment section 160 is slidable with respect to wafer conveyance section 60, access can be gained to mounter 20 easily. On the other hand, because the range in which wafer replenishment section 160 can be slid is regulated, interference between wafer replenishment section 160 and an adjacent component mounting system can be prevented. As a result, the access area to mounter 20 for operators can be enlarged while controlling the increase in size of component mounting system 10.

Also, with component mounting system 10 of the present embodiment, the angle in the θ direction of wafer sheet W2 loaded on wafer table 88 can be adjusted to a predetermined angle. As a result, the moving distance of mounting head 30 can be shortened such that productivity can be improved. Also, by using R guide 82 and cross guides 80a and 80b in the mechanism for rotating wafer table 88 about the θ axis, wafer table 88 can be rotated about the θ axis with a simple mechanism.

Also, when supplying component W1 face-down, multiple components W1 can be transferred from pickup head 100 to mounting head 30 at the same time. Due to this, the quantity of transfers of components W1 can be reduced such that productivity can be improved.

The above described details of the present embodiment, but these are only an example and in no way restrict the claims of the present application. The technology given in the claims of the present application includes various changes and modifications to the specific examples illustrated above.

For example, various forms can be adopted for the arrangement of suction nozzles 114a and 114b of pickup head 100 and the arrangement of suction nozzles 32 of mounting head 30. It is acceptable for the arrangement of suction nozzles of pickup head 100 to match completely the arrangement of suction nozzles of mounter head 30, or to match only a portion of them. Also, various mechanisms can be used for a mechanism which flips suction nozzles 114a and 114b of pickup head 100.

The technical elements described in this specification and the figures can exhibit technical utility alone or in various combinations, and are not limited to the combination disclosed in the claims at the time of application. Also, the examples of the technology in this specification and the figures achieves multiple purposes at the same time but can also exhibit technical utility by achieving one among those purposes.

The invention claimed is:

1. A component supply device arranged adjacent to a mounter having a mounting head that mounts components on a board, the component supply device supplying the components to the mounter, comprising:
a wafer sheet replenishment section which replenishes a wafer sheet on which multiple components are arranged; and
a wafer sheet conveyance section which conveys a wafer sheet supplied from the wafer sheet replenishment section, the wafer sheet conveyance section including a table on which the wafer sheet is carried and a pickup head which picks up a component on the wafer sheet carried on the table;
wherein the pickup head includes multiple component supply side suction nozzles, and a switching mechanism which switches the multiple component supply side suction nozzles between a pickup position at which a respective tip of the multiple component supply side suction nozzles faces down and between a transfer position at which the respective tip of the multiple component supply side suction nozzles faces up;
wherein the switching mechanism includes a pinion gear fixed to a rotation axis around which the multiple component supply side suction nozzles rotate, the pinion gear engaged with a rack which is movable to rotate the pinion gear; and
wherein an arrangement of the multiple component supply side suction nozzles corresponds to an arrangement of multiple mounter side suction nozzles equipped on the mounting head of the mounter.

2. The component supply device according to claim 1, wherein the pickup head is attached movably in a level plane with respect to the table;
wherein the wafer sheet conveyance section is provided with a mechanism which raises and lowers the table to which the pickup head is attached between a direct supply position and an indirect supply position which is below the direct supply position; and
wherein a height of the table when the table is positioned at the direct supply position and when the pickup head is positioned above the pickup table, matches a height of the component supply side suction nozzles when the table is positioned at the indirect supply position and when the component supply side suction nozzles are positioned at the transfer position.

3. The component supply device according to claim 1, wherein the pickup head further includes a first housing and a second housing which is rotatably supported around the rotation axis with respect to the first housing and to which the multiple component supply side suction nozzles are attached.

4. The component supply device according to claim 3 wherein the switching mechanism further includes a rotation speed adjusting mechanism which decreases the rotation speed of the second housing in an area near the pickup position and near the transfer position, slower than the rotation speed of the second housing in other areas.

5. The component supply device according to claim 1, wherein the switching mechanism includes a cam follower attached to an end of the rack, the cam follower including a groove in which a pin is engaged.

6. The component supply device according to claim 5, wherein the pin is fixed to a rotation member, and rotation by the rotation member moves the pin moves the pin in the groove to move the rack.

* * * * *